United States Patent [19]
Tani

[11] Patent Number: 5,468,993
[45] Date of Patent: Nov. 21, 1995

[54] SEMICONDUCTOR DEVICE WITH POLYGONAL SHAPED DIE PAD

[75] Inventor: Koji Tani, Kyoto, Japan

[73] Assignee: Rohm Co., Ltd., Kyoto, Japan

[21] Appl. No.: 353,345

[22] Filed: Dec. 5, 1994

Related U.S. Application Data

[63] Continuation of Ser. No. 15,446, Feb. 9, 1993, abandoned.

[30] Foreign Application Priority Data

Feb. 14, 1992 [JP] Japan .................................... 4-028208

[51] Int. Cl.⁶ ................................................ H01L 23/28
[52] U.S. Cl. ........................ 257/676; 257/669; 257/674
[58] Field of Search .................................... 257/676, 669, 257/674

[56] References Cited

U.S. PATENT DOCUMENTS

| | | | |
|---|---|---|---|
| 4,951,119 | 8/1990 | Yonemochi et al. | 257/676 |
| 5,043,791 | 8/1991 | Stokes et al. | 257/669 |
| 5,327,008 | 7/1994 | Djennas et al. | 257/674 |

FOREIGN PATENT DOCUMENTS

| | | |
|---|---|---|
| 58-51526 | 3/1983 | Japan . |
| 60-7160 | 4/1985 | Japan . |
| 2283054 | 3/1990 | Japan . |
| 3116763 | 5/1991 | Japan .................................... 257/676 |
| 5-326815 | 12/1993 | Japan . |

OTHER PUBLICATIONS

Wentworth, Plane and Solid Geometry, Apr. 16, 1958, pp. 218–219.

*Primary Examiner*—William Mintel
*Assistant Examiner*—Roy Potter
*Attorney, Agent, or Firm*—Nikaido Marmelstein Murray & Oram

[57] ABSTRACT

A semiconductor device includes a rectangular semiconductor chip bonded to a die pad of a lead frame in which a plurality of leads are arranged around the die pad. An area where the semiconductor ship is electrically connected with the leads around the semiconductor chip and the semiconductor chip are sealed with a resin. A distance between the semiconductor chip and a peripheral wall of the die pad is larger at a central portion of each side of the chip than at each corner of the chip. The leads are arranged such that a line connecting all lead ends is substantially parallel with the peripheral wall of the die pad.

6 Claims, 2 Drawing Sheets

SEMICONDUCTOR DEVICE WITH POLYGONAL SHAPED DIE PAD

This application is a continuation of application Ser. No. 08/015,446 filed Feb. 9, 1993 now abandoned.

FIELD OF THE INVENTION

The present invention relates to a semiconductor device wherein a semiconductor chip bonded to a die pad of a lead frame and the bonded area are sealed by synthetic resin molding, and more particularly to a semiconductor device wherein the shape of the die pad is improved for preventing an accidental short circuit with lead wires (hereinafter referred to as leads) due to squeeze-out of die bonding material used.

BACKGROUND OF THE INVENTION

Conventionally, a semiconductor chip is die-bonded to a die pad of a lead frame, the semiconductor chip is bonded to leads radially disposed around the die pad with gold wires or the like by means of wire-bonding, and the semiconductor chip and the bonded portion are sealed by synthetic resin molding (hereinafter referred to as "molding"), whereby a semiconductor device is formed. FIG. 3 shows an example of such conventional semiconductor devices wherein leads are arranged around a die pad of a lead frame.

In FIG. 3, numeral 1 denotes a die pad; numeral 2 denotes leads; numeral 3 denotes a semiconductor chip; numeral 4 denotes a preform material comprising silver paste, Au—Si, solder, glass or the like, which is used as a material for die-bonding in order to bond the semiconductor chip 3; and numeral 5 denotes a gold for electrically connecting an electrode pad of the semiconductor chip 3 to each of the leads 2. When the semiconductor chip is fitted to the lead frame, the preform material 4 is firstly applied to the central portion of the die pad 1 of the lead frame, and the semiconductor chip 3 then bonded to the die pad by pressing it from the upper side. Since the semiconductor chip 3 is generally formed by cutting a semiconductor wafer, typically it formed in a square, and the shape of the die pad 1 typically a square greater than the semiconductor chip 3. If an amount of the preform material used for bonding the semiconductor chip 1 is too small, the strength of the bonding between the semiconductor chip 3 and the die pad 2 is insufficient. This brings separating of the semiconductor chip in the course of the production process, deteriorating of the characteristics due to an increase in electrical resistance, and deteriorating of the characteristics of the semiconductor chip 3 due to an increase in temperature which is caused by poor thermal conduction. If amount of the preform material 4 is too large, the preform material 4 is squeezed out from a rear face of the semiconductor chip 3, as shown in FIG. 3. In this case, since the preform material 4 is applied in a circular form to the central portion of the die pad 1, the preform material 4 is circularly spread on pressing the semiconductor chip 3 and is thus squeezed out from a central portion of each side of the semiconductor chip 3, without being squeezed out from the corners thereof.

As described above, a sufficient amount of preform material 4 must be applied for securing the bonding of the semiconductor chip 3. However, there has recently been the tendency that the distance between the semiconductor chip 3 and the peripheral wall of the die pad 1, and the distance between the die pad 1 and the leads 2 are decreased with a recent increase in degree of integration and a recent decrease in size of a semiconductor device. Thus, the preform material 4 squeezed out from the periphery of the semiconductor chip 3 is undesirably extended beyond the die pad 1 and comes into contacts with the leads 2, thereby an accidental short circuit occurs.

In order to prevent the preform material 4 from contacting with the leads 2 even if the preform material 4 is squeezed out from the central portion of each side of the semiconductor chip 3 and is extended beyond the die pad 1, and to improve workability of wire bonding to each lead 2, there has been employed a lead frame wherein lines connecting the tips of the leads 2 are curved so that the tips of the leads 2 are apart from portions where the preform material 4 is mostly squeezed out, as shown in FIG. 4. However, if the distance between the tip of each lead 2 and the peripheral wall of the die pad 1 is non-uniform, stress is applied by resin to the corners of the die pad 1 during resin molding. Thus, there arises a problem that a failure such as shift of the leads 2, wire distortion and the like occurs particularly at the corners, or that the die pad is shifted. With a decrease in size of semiconductor devices and an increase in degree of integration thereof, that tendency remarkably arises in a narrow-pitched semiconductor device wherein the leads are made thin, and the pitch between the leads 2 is decreased.

SUMMARY OF THE INVENTION

Considering the above circumstances, an object of the present invention is to provide a semiconductor device which permits reliable bonding of semiconductor chip, which prevents accidents due to the squeezing out of the preform material used, and which prevents wire distortion and shift of the leads or die pad during molding.

According to the present invention, there is provided a semiconductor device comprising a rectangular semiconductor chip bonded to a die pad of a lead frame in which a plurality of leads are arranged around the die pad, and an area wherein the semiconductor chip electrically connected with the leads around the semiconductor chip and the semiconductor chip are sealed with a resin, a distance between the semiconductor chip and a peripheral wall of the die pad being made larger central portion of each side of the chip than at each corner of the chip, and the leads being arranged such that a line connecting all lead ends substantially parallel with the peripheral wall of the die pad.

In the present invention, since portions of a die pad, which respectively correspond to central portions of sides of a square semiconductor chip, are outwardly widened, the die pad prevents preform material from not being outwardly extended beyond the die pad due to the widened area even if the preform material is squeezed out from a rear face of the semiconductor chip, thereby an accidental short circuit with the leads is prevented.

In addition, since lines connecting tips of leads are substantially parallel with a peripheral wall of the die pad, the resin uniformly flows without generating local stress during resin molding. This enables molding without producing wire distortion or shift of the leads or the die pad.

DETAILED DESCRIPTION

Figure 1:
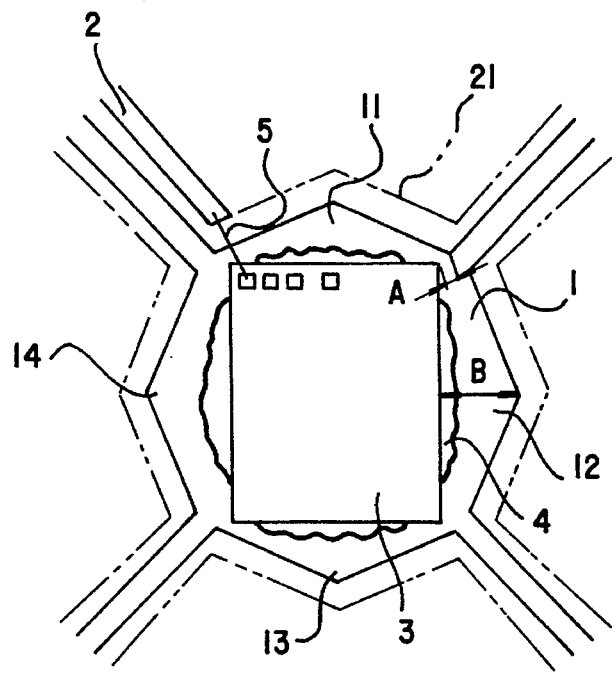
FIG. 1 is an explanatory view showing an embodiment of the present invention where a semiconductor chip is bonded to a die pad.
Figure 3:
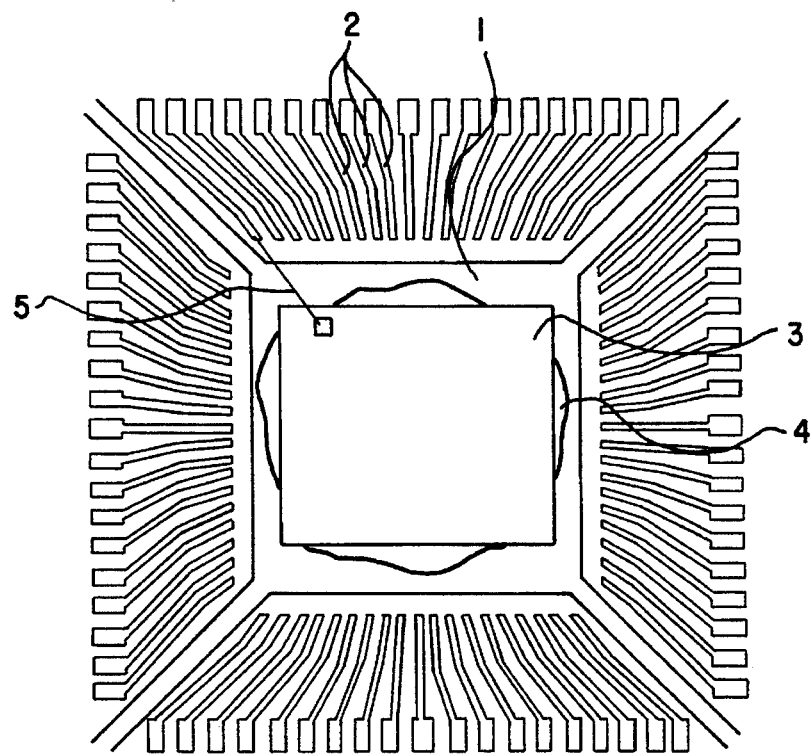
FIG. 3 is an explanatory view showing an arrangement of a die pad, a semiconductor chip and leads in a conventional semiconductor device.
Figure 4:
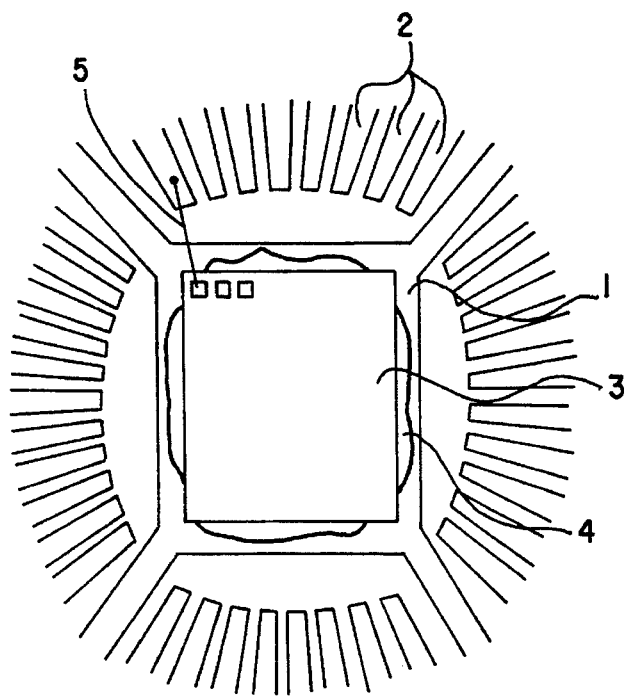
FIG. 4 is an explanatory view showing an example of a conventional semiconductor devices where envelope of tips of leads is curved.

The present invention is described below with reference to the drawings. FIG. 1 is an explanatory view showing an embodiment of the present invention where a semiconductor chip is bonded to a die pad. The same numerals as those shown in FIG. 3 denote the same portions. In FIG. 1, almost all leads are not shown, and a line 21 connecting the tips of all the leads and positions of the leads are shown by a two-dot chain line. In this embodiment, the shape of the die pad 1 is not square, but central portions of each side of a square are outwardly widened to form wide portions 11 to 14. The formation of the wide portions 11 to 14 makes the die pad 1 octagonal. In the octagonal die pad 1, portions which respectively correspond to central portions of sides of a square semiconductor chip 3 are corners, and a distance B between the central portion of each side of the semiconductor chip 3 and the peripheral wall of the die pad 1 is thus larger than a distance A between each corner of the semiconductor chip 3 and the peripheral wall of the die pad 1.

As a result, a space, in which a preform material 4 squeezed out thereon is allowed to remain, is formed near the central portion of each side of the semiconductor chip 3. Thus, the preform material 4 is prevented from being extended beyond the die pad 1 and an accidental short circuit with the tips of leads 2 will not occur.

In the present invention, the semiconductor device is formed such that lines 21 connecting the tips of the leads is substantially parallel with the peripheral wall of the die pad 1. As a result, during resin molding, stress is not applied locally to the lead ends and the like, and shifting of the die pad 1 or the leads 2, or wire distortion does not occur, whereby resin molding can be performed with high reliability. In addition, since the tips of the leads 2 in the central portion of each side of the semiconductor chip 3 are also disposed such that the line connecting the lead tips is outwardly curved in the same way as the die pad 1, and since the tips of the leads are positioned at substantially equal distances from the center of the die pad 1, each corner of the semiconductor chip 3 has a space large enough for wire layout, and wire distortion or the like scarcely happens during resin molding.

Further, the octagonal shape of the die pad 1 produces sufficient space between the periphery of the semiconductor chip 3 and the peripheral wall of the die pad 1 to widen the accommodatable range for chip size, whereby enabling application of existing lead frames to a semiconductor chip 3 having a slightly increased size.

In this condition, the semiconductor chip is electrically connected to each lead by wire-bonding or the like, and the leads are molded with a synthetic resin so as to be isolated from each other. Thus, a semiconductor device can be realized.

Figure 2:
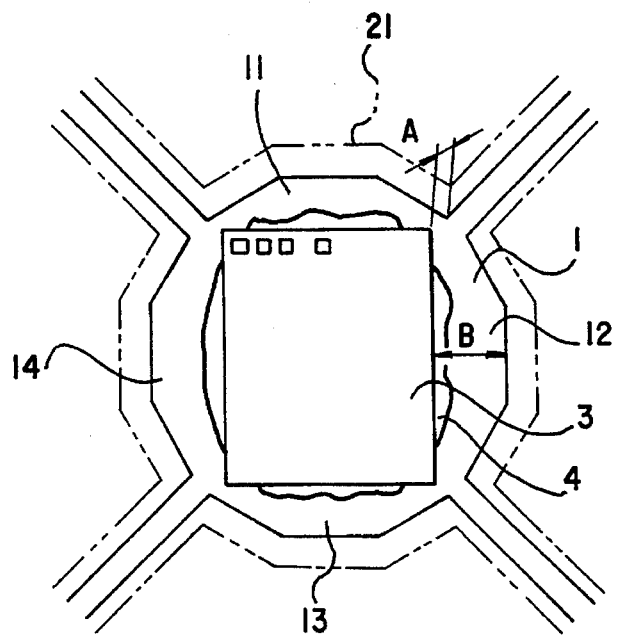
FIG. 2 is an explanatory view showing another embodiment of the present invention where a semiconductor chip is bonded to a die pad.

Although the above-mentioned embodiment concerns such an octagonal die pad that the corners thereof are respectively placed in the central portions of the sides of the semiconductor chip, portions of the die pad 1 near the central portions of the sides of the semiconductor chip 3 might be flat, as shown in FIG. 2 where a semiconductor chip 3 is bonded to another die pad 1. In short, the present invention is characterized in that the distance B between the peripheral wall of the die pad 1 and the central portion of each side of the semiconductor chip 3 is greater than the distance A between the peripheral wall of the die pad 1 and each corner of the semiconductor chip 3. In the embodiment shown in FIG. 2, the die pad 1 is formed into a dodecagon like shape wherein the peripheral wall of the die pad 1 is formed so as to be parallel with one side of the semiconductor chip 3 near the central portion the semiconductor chip 3, but the distance B between the peripheral wall of the die pad 1 and the central portion of each side of the semiconductor chip 3 is greater than that in other portions.

As a result, like in the above-mentioned embodiment, a space, where the preform material 4 is squeezed out is formed near the central portion of each side of the semiconductor chip 3, thereby the preform material 4 is prevented from being extruded beyond the die pad 1 and an accidental short circuit with the tips of the leads 2 is also prevented.

Also in this embodiment, the tips of each lead (in FIG. 2, the leads are not shown, and the line 21 connecting the tips of each lead and the position of the leads are shown by a two-dot chain line) is made substantially parallel with the peripheral wall of the die pad 1. Due to this, during resin molding, no local stress is applied to the tips of the leads and the like, shift of the die pad 1 or the leads 2 or wire distortion does not occur, and defects in the molding process have been significantly decreased.

Although the above embodiments respectively concern an octagonal and a dodecagonal die pads, the die pad might be formed into any other polygon. Further, the corners are not necessarily be formed and might be curved. However, when a lead frame is formed by press working using a mold, a circular die pad is undesirable because it is difficult to form the mold to have a circular shape. When a lead frame is formed by etching, a die pad can be formed in a circular shape. However, this is not suitable for mass production and polygonal pads are preferably considered as a basic.

In addition, it is sufficient that the leads are so arranged that the line connecting the tips thereof is substantially parallel with the peripheral wall of the die pad. The line need not be completely parallel with the peripheral wall, and if it is substantially parallel therewith, the above function and effect of the present invention are provided.

As described above, in the present invention, since the die pad is widened where the preform material is easily squeezed out from the central portions of the sides of the semiconductor chip, the preform material squeezed out can remain in the widened portions, which brings an effect of significantly decreasing failures caused by a short circuit of the squeezed out preform material with the lead tips. In addition, since sufficient space is produced between the periphery of the semiconductor chip and the periphery of the die pad, an existing lead frame can be applied to a semiconductor chip having a slightly increased size.

Further, since each of the leads is arranged such that the line connecting the tips of all leads substantially parallel with the peripheral wall of the die pad, each lead end wherein the semiconductor chip electrically connected to each lead by wire-bonding or the like, is positioned from the center of the die pad by substantially equal distance, thereby producing a space large enough for wire layout in each corner. In addition, no local stress is generated during resin molding because the lead ends are positioned at substantially equal distances from the die pad. Thus, there is an effect of significantly decreasing the failures caused by distortion of wire or shift of the leads or the die pad during resin molding.

As a result, the present invention brings an effect of improving the yield of the semiconductor device to contribute to cost reduction of the semiconductor device and in turn cost reduction of electronic device products.

Though several embodiments of the present invention described above, it is to be understood that the present invention is not limited to the above-mentioned embodiments, and various changes and modifications may be made in the invention without departing from the spirit and scope thereof.

What is claimed is:

1. A semiconductor device, comprising:

a rectangular semiconductor chip bonded to a die pad of a lead frame in which a plurality of leads are arranged around the die pad, wherein the die pad is formed in a polygonal shape, with a finite number of straight edged sides and with at least six sides, and an area where the semiconductor chip is electrically connected with the leads around the semiconductor chip and said semiconductor chip are sealed with resin, wherein a distance between said semiconductor chip and a peripheral wall of said die pad is larger at a central portion of each side of said chip than at each corner of the chip, wherein the leads are arranged such that a line connecting all leads is substantially parallel with the peripheral wall of said die pad.

2. The semiconductor device of claim 1 wherein the die pad has an octagonal like shape.

3. The semiconductor device of claim 1 wherein the die pad has a dodecagon like shape.

4. The semiconductor device of claim 1 wherein a distance between said semiconductor chip and said line connecting all lead ends is larger at said central portion of each side of said chip than at each corner of the chip.

5. The semiconductor device of claim 1 wherein tips of the leads are positioned at substantially equal distances from a center of the die pad.

6. A semiconductor device, comprising:

a rectangular semiconductor chip bonded to a die pad of a lead frame in which a plurality of leads are arranged around the die pad, wherein the die pad is formed in polygonal shape having not more than twelve straight edged sides and with at least six sides and an area where the semiconductor chip is electrically connected with the leads around the semiconductor chip and said semiconductor chip are sealed with resin, wherein a distance between said semiconductor chip and a peripheral wall of said die pad is larger at a central portion of each side of said chip than at each corner of the chip, wherein the leads are arranged such that a line connecting all leads is substantially parallel with the peripheral wall of said die pad.

* * * * *